United States Patent [19]

Perahia

[11] Patent Number: 4,563,653

[45] Date of Patent: Jan. 7, 1986

[54] SERVO PREAMPLIFIER AND DEMODULATOR CHAIN USING TRANSCONDUCTANCE BALANCED MODULATORS

[75] Inventor: Avraham Perahia, San Jose, Calif.

[73] Assignee: Pertec Computer Corporation, Los Angeles, Calif.

[21] Appl. No.: 421,845

[22] Filed: Sep. 23, 1982

Related U.S. Application Data

[62] Division of Ser. No. 248,992, Mar. 30, 1981, Pat. No. 4,384,309.

[51] Int. Cl.$^4$ .......................... H03G 3/10; H03P 3/45
[52] U.S. Cl. .................................... 330/254; 330/279; 330/310
[58] Field of Search ................. 330/51, 129, 254, 279, 330/281, 284, 310; 307/127

[56] References Cited

U.S. PATENT DOCUMENTS 3,452,289  6/1969  Ryan .................................... 330/254
4,514,702  4/1985  Zogg .................................... 330/254

Primary Examiner—Eugene R. LaRoche
Assistant Examiner—Steven J. Mottola
Attorney, Agent, or Firm—Freilich, Hornbaker, Rosen & Fernandez

[57] ABSTRACT

An improved servo demodulator channel employing a transconductance balanced modulator as a polarity switch, an AGC amplifier and a signal separation circuit. A transconductance balanced modulator comprises two amplification transistors and four output transistors which together form two signal channels, each comprised of an amplification transistor connected in parallel to two output transistors. In a specific embodiment, the transistors are n-p-n transistors, the emitters of the two output transistors associated with a given channel being connected to the collector of the amplification transistor. The transconductance balanced modulator is configured so that the two amplification transistors are interconnected as a differential amplifier, and the base electrode of an output transistor in one signal channel is connected to the base electrode of an output transistor in the other signal channel, the base electrodes of the other two output transistors also being interconnected. Each interconnected pair of base electrodes is connected to a control signal terminal pair. The invention discloses a means whereby a transconductance balanced modulator configured as above-described can be operated as a polarity switch, an AGC amplifier and a signal separation circuit in a servo preamplifier and demodulator chain for use in magnetic disk head positioning systems.

2 Claims, 3 Drawing Figures

SERVO PREAMPLIFIER AND DEMODULATOR CHAIN USING TRANSCONDUCTANCE BALANCED MODULATORS

This is a division of application Ser. No. 248,992, filed Mar. 30, 1981, now U.S. Pat. No. 4,384,309, issued May 17, 1983.

FIELD OF THE INVENTION

The invention relates to electronic circuits for polarity switching, AGC amplification and signal switching.

BACKGROUND OF THE INVENTION

A typical head positioning system for a magnetic disk drive includes a servo loop using a dibit position encoding technique to derive error positioning information. The dibit technique involves the recording of servo information components on two servo tracks located at the sides of a data track, the servo information either being on a dedicated servo surface or embedded into dedicated portions of data surfaces. The two servo information components are prerecorded by two equal-amplitude, sinusoidal waveforms having the same frequency but displaced 90 degrees with respect to each other. The servo information is read by a head which produces a composite dibit signal comprised of servo information components read from both sides of the data track. A clock pulse identifies alternating segments of the composite signal, the first 180 degrees of the composite signal defining a first segment set and the other 180 degrees defining a second segment set. The peak-to-peak voltage of the first segment set is compared to the peak-to-peak voltage of the second segment set. If the head is centrally positioned with respect to a desired data track, the peak-to-peak voltage of the two segment sets will be equal. As the head moves off position with respect to the desired data track, the amplitude of one segment set will change with respect to the amplitude of the other segment set. This amplitude imbalance produces an error positioning signal which is fed back to the head positioner to reposition the head until the amplitudes again become equal. The direction of repositioning is determined by whether the head is being positioned over an odd or even numbered data track.

For proper operation of one type of servo preamplifier and demodulator chain, the dibit signal appearing at the output of the head must have its polarity determined according to the data track being sought as above-explained, be amplified by an amplifier having a substantially constant output voltage regardless of input level variations, and be separated into first and second segments in accordance with alternating states of an external clock signal. Conventional servo systems accomplish the above with various types of circuitry well-known in the art. A first-stage preamplifier having adjustable gain is usually provided by an integrated circuit having gain controlled by some version of voltage or current controlled resistor, such as a field effect transistor (FET). This type of resistor is very nonlinear for higher input signals and the amplitude of an input signal has to be small to reduce adverse effects of this nonlinearity. Thus, automatic gain control is frequently implemented in the first stage even though at this point it might reduce the signal-to-noise ratio and/or cause distortion. The polarity switch is conventionally implemented by various techniques using transformers and/or MOS switches. These circuits are costly and introduce errors because of limited bandwidth, stray fields and non-ideal characteristics of the switch and/or transformer. In order to eliminate some of the above problems, one approach has been to implement two separate channels, one for each polarity. Such a solution at best is more expensive. The signal separator is usually constructed utilizing a combination of diode switches activated by logic circuits and a clock pulse. In order to implement the above-described functions, conventional servo preamplifier and demodulator circuits utilize many different types of components which are expensive both in terms of procurement cost and fabrication time.

SUMMARY OF THE INVENTION

The present invention provides an improved servo demodulator channel comprised of first, second and third identical circuits interconnected to function respectively as a polarity switch, an automatic gain control amplifier and a signal separator. Each circuit includes a pair of input signal terminals, a pair of control signal terminals and four output terminals. The dibit signal from the servo head is connected to the input signal terminals of the first identical circuit and a polarity control signals is connected to the control signal terminals. The four output terminals are interconnected to form an output terminal pair for an amplified dibit signal having a polarity in accordance with that indicated by the polarity control signal. The output dibit signal from the first circuit is connected to the input signal terminals of the second identical circuit and an automatic gain control voltage is connected to its control signal terminals. Its four output terminals are again interconnected to form an output terminal pair for a further amplified dibit signal having an amplitude proportional to the amplitude of the automatic gain control voltage. The further amplified dibit signal is connected to the input signal terminals of the third identical circuit, and a clock pulse having first and second voltage states is connected to the control signal terminals. The four output terminals are grouped to form two output terminal pairs, the first output terminal pair providing an amplified dibit signal during the time interval when the clock pulse is in the first voltage state and no dibit signal when the clock pulse is in the second voltage state, and the second output terminal pair providing an amplified dibit signal during the time interval when the clock pulse is in the second voltage state and no output when the clock pulse is in the first voltage state. The outputs of the first and second output terminal pairs are detected and then compared. Their sum is used to generate the automatic gain control voltage to control the gain of the demodulator channel, and their difference is used to reposition the servo head until the outputs at the first and second output terminals are equal. Thus, three identical circuits have been utilized to accomplish the polarity switching, automatic gain control amplification, and signal separation functions of a servo demodulator channel.

The identical circuits in the demodulator channel described above can be formed from the circuit elements used in a transconductance balanced modulator, one type of which is commercially available in a RCA linear integrated circuit chip catalog number CA3102E. However, a six-transistor array to be explained below could be readily assembled, and the invention is in no way limited to circuitry provided on an IC chip. A typical transconductance balanced modulator consists of two parallel circuits each consisting of an n-p-n type amplifying transistor, the collector of which is connected to the emitters of two additional n-p-n type output transistors. The emitter of each amplifying transistor is connected to a corresponding constant current source. Each side of an input signal is connected to a base electrode of one of the amplifying transistors. Each side of a control signal input is connected to the base electrodes of two output transistors, one of which is connected to one amplifying transistor and the other of which is connected to the other amplifying transistor. Output signals appear at the collectors of the output transistors. The emitters of the two amplifying transistors are connected to each other through a predetermined impedance, which could be a short, thereby causing the two amplifying transistors to act as a differential amplifier. As the control signal to the output transistors is varied, the constant current flowing through each amplifying transistor is correspondingly divided between its two output transistors. It is this division of current through each output transistor pair, and an interconnection of the four output signals to be explained below, that provide a basis for the teachings of the invention.

A transconductance balanced modulator as abovedescribed can be configured and controlled in various ways so as to provide a polarity switch, an AGC amplifier and a signal separation circuit. In a first configuration, the two amplifying transistors are interconnected as a differential amplifier comprising a first and second amplifying means, and the collectors of the four output transistors are interconnected so that the collectors of each transistor connected to one side of the control signal are interconnected and the collectors of each transistor connected to the other side of the control signals are interconnected, each interconnected pair of collectors comprising one output terminal for the modulator. As each pair of output transistors is alternately biased from cut-off to full conduction by the control signal, the polarity of an amplified input signal appearing at the output terminals will shift by 180 degrees. Thus, by alternately directing current flow through the two output transistors associated with each amplifying transistor, a polarity reversal of the output signal can be effected.

According to a second feature of the invention, the transconductance balanced modulator can be operated so that the the current flowing through each of the amplifying transistors of the differential amplifier is divided between the two output transistors connected to each of the amplifying transistors, the division being in proportion to an automatic gain control (AGC) voltage applied at the control signal input. The automatic gain control voltage is chosen so that none of the transistors are biased to cut-off, thereby assuring that the current flowing through each output transistor is proportional to the AGC voltage. The output transistor collectors are interconnected as described for the polarity switch, so that the voltage at each output terminal is a sum of a voltage developed by current flowing through two output transistors, one of which is connected to each of the amplifying means. Since signal currents through each side of a differential amplifier are 180 degrees out of phase with each other, the voltage at each output terminal is actually the difference between the output voltages of its two respective output transistors, the current in each output transistor pair associated with each amplifying transistor being divided in proportion to the AGC voltage. Thus, the invention teaches a means whereby current through each side of a differential amplifier can be divided and summed so that a resulting output signal is proportional to a control signal input.

In accordance with a third feature of the invention, the transconductance balanced modulator is configured as abovedescribed except that a first output signal is developed across the two output transistors connected to one side of the control signal input, and a second output signal is developed across the two transistors connected to the other side of the control signal input. If the control signal input, for example a clock pulse, alternately biases each pair of output transistors to cut-off, then one can appreciate that an amplified input signal will alternately appear as the first output signal and then as the second output signal. If the clock pulse is synchronized to the input signal, then each output signal segment corresponding to one state of the clock pulse will always appear at the same output terminals.

DETAILED DESCRIPTION

As required, detailed illustrative embodiments of the invention are disclosed herein. These embodiments exemplify the invention and are currently considered to be the best embodiments for such purposes. However, it is to be recognized that other means for dividing the currents associated with each side of the differential amplifier could be utilized. Accordingly, the specific embodiments disclosed are representative in providing a basis for the claims which define the scope of the present invention.

As previously explained the invention discloses a means whereby a differential amplifier having a first amplifier and a second amplifier, and a means for dividing current flowing through each amplifier, can be configured as a polarity switch, an AGC amplifier and a signal separation circuit.

Figure 1:
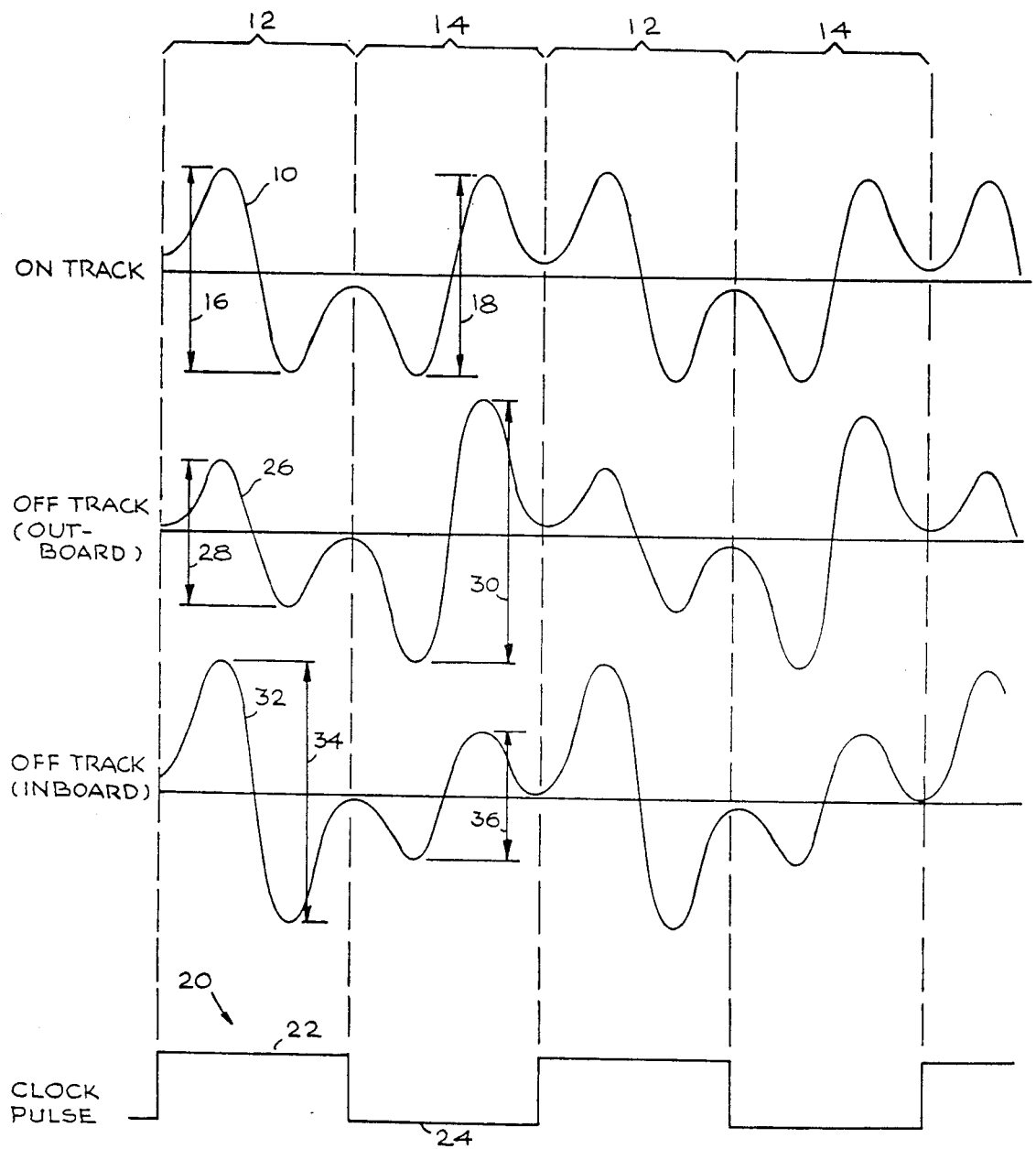
FIG. 1 shows output voltages from the servo head of a magnetic disk memory system utilizing a dibit position encoding technique.

An explanation of the invention will be facilitated by first describing a problem which the invention is particularly adapted to solve. A dibit position encoding technique utilized for closed loop positioning of a servo head of a magnetic disk memory system is well known in the digital computer art. A rotating disk utilizing the dibit technique has each data track located between two servo tracks, the servo tracks containing positioning information for the servo head. The servo tracks can be either on dedicated servo surfaces or embedded into dedicated portions of data surfaces. The two servo tracks on each side of the data track each contain a sinusoidal waveform having the same amplitude and frequency as the other. However, one waveform is displaced 90 degrees in phase with respect to the other waveform. Referring to FIG. 1, if the servo head is precisely positioned between the two servo tracks, an on-track signal 10 appears at the output of the servo head, the signal being a summation of the 90 degree phase-shifted waveforms on each servo track. If the on-track signal 10 is divided into two alternately repeating segments, 12 and 14, each segment comprising a full cycle of information, then the peak-to-peak voltage of the first segment 12 as shown at 16 will be equal to the peak-to-peak voltage of the second segment 14 as shown at 18. The segments 12 and 14 are identified by a clock pulse 20, a first state 22 of which defines the first segment 12 of the on-track signal 10 and a second state 24 which defines the second segment 14.

If the servo head drifts off-track in an outboard direction, for example, the dibit signal at the servo head will appear as shown at 26. As this occurs, the peak-to-peak voltage in the first segment 12 as shown at 28 will decrease while the peak-to-peak voltage of the second segment 14 as shown at 30 increases. The imbalance between the two peak-to-peak signals 28 and 30 is indicative of the servo head being off-track, and the actual voltage differential is proportional to the amount of correction required to reposition the servo head as to obtain the on-track signal 10. In a similar manner, if the servo head drifts toward an off-track inboard position, an inboard off-track signal appears as shown at 32. The inboard off-track signal 32 is characterized by a peak-to-peak voltage in the first segment 12 as shown at 34 that is greater than the peak-to-peak voltage in the second segment 14 as shown at 36. Again, the voltage imbalance between the peak-to-peak signals 34 and 36 is proportional to displacement of the servo head inboard of the data track and can be utilized to develop a corrective signal to reposition the servo head so as to obtain the on-track signal 10.

The on-track, outboard off-track, and inboard off-track signals, 10, 26, and 32 respectively, as detected by the servo head are weak and vary considerably in amplitude. Because the magnitude of the above-mentioned voltage imbalances characterize the corrective signals for repositioning the servo head, it is essential that these signals 10, 26 and 32 be amplified by an amplifier having a variable gain control so that the output voltage of the amplifier is constant. In addition, the polarity of the off-track signal 26 or 32 determines whether, for a given voltage imbalance, the servo head is to be driven in an inboard or outboard direction. One polarity state is assigned by a control electronics system to odd-numbered data tracks and the other polarity is assigned to even-numbered tracks. If the servo head is to be centered on an odd-numbered track, a polarity control signal indicative of the proper polarity of the amplified dibit signal for an odd-number track is provided, thereby causing the servo head to be driven in one direction. If the servo head is to be centered on an even-numbered track, the polarity control signal will cause polarity of the amplified dibit signal to be shifted 180 degrees with respect to that of the output signal associated with an odd-numbered track, thereby causing the servo head to be driven in the other direction.

Thus as one can appreciate, a servo preamplifier and modulator for a dibit type positioning system requires a polarity switch operated by an external polarity control signal, an AGC amplifier that will provide a substantially constant output voltage for varying input voltages, and a signal separator for dividing an output signal into alternating segments according to the high or low state of a synchronized clock pulse. The invention discloses a transconductance balanced modulator circuit which can be configured and operated in various ways to accomplish all of the above functions.

Figure 2:
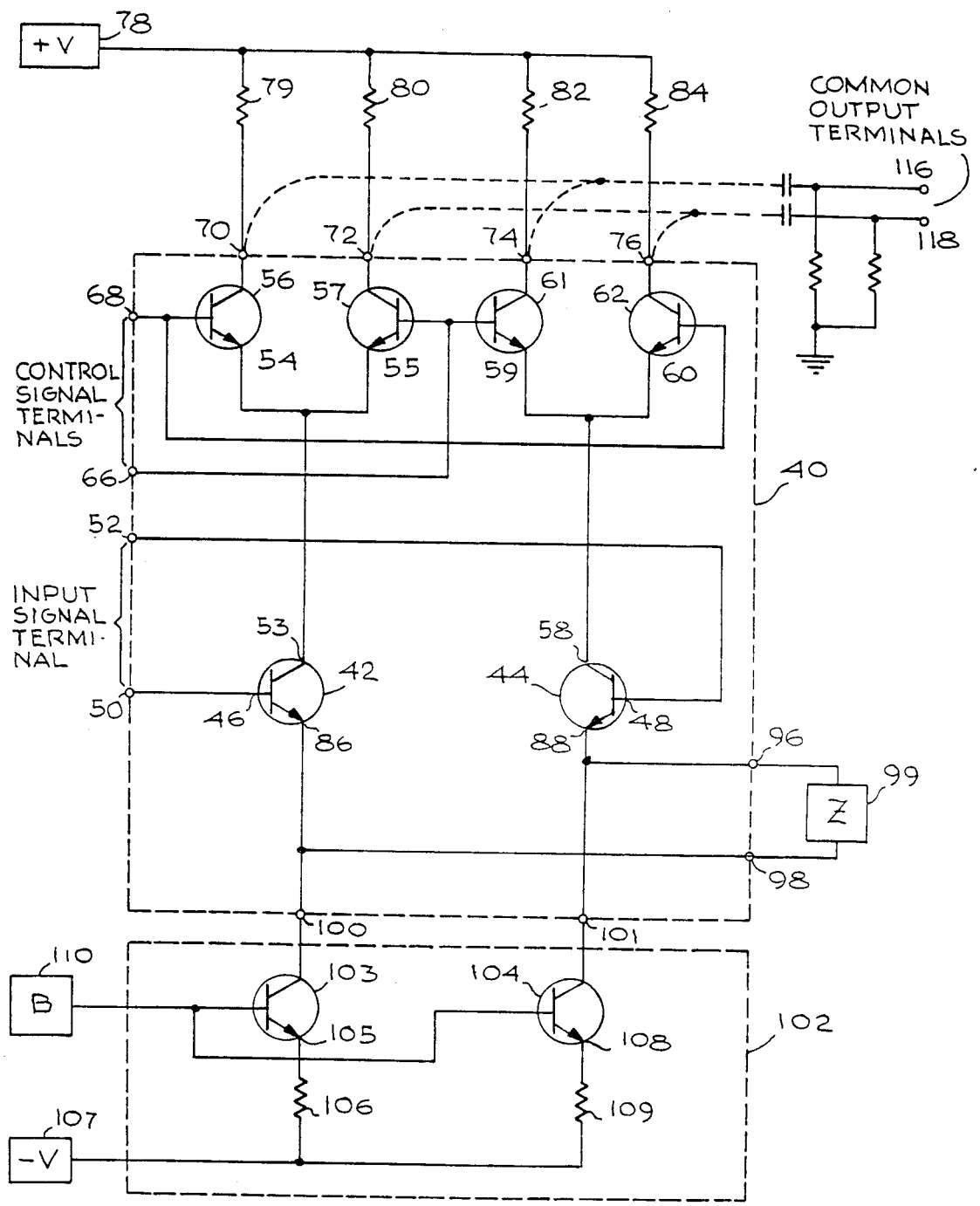
FIG. 2 is a schematic diagram of a transconductance balanced modulator.

Referring to FIG. 2, a typical transconductance balanced modulator 40 is shown within the dotted lines. It comprises a first amplifying transistor 42 and a second amplifying transistor 44, the transistors being n-p-n types although p-n-p transistors could be utilized by appropriate selection of supply voltages. The base electrodes 46 and 48 of the first and second amplifying transistors 42 and 44 are connected to two signal input terminals 50 and 52. The first amplifying transistor collector 53 is connected to the emitters 54 and 55 of a first pair of current dividing transistors 56 and 57. In a similar manner, the second amplifying transistor 44 also has its collector 58 connected to the emitters 59 and 60 of a second pair of current dividing transistors 61 and 62. Biasing of the four current dividing transistors 56, 57, 61 and 62 is controlled by a control signal applied across two control signal input terminals 66 and 68. One terminal 66 is connected to the base electrodes of two current dividing transistors 57 and 61, one of which is chosen from the first current dividing transistor pair 56 and 57 and the other of which is chosen from the second current dividing transistor pair 61 and 62. The other control signal terminal 68 is connected to the base electrodes of the other two current dividing transistors 56 and 62. Output terminals for each of the four current dividing transistors 56, 57, 61 and 62 are provided at their respective collector terminals 70, 72, 74 and 76. Power is supplied by a positive dc voltage source 78 to each of the current dividing transistors 56, 57, 61 and 62 through voltage dropping resistors 79, 80, 82 and 84. The two amplifying transistors 42 and 44 have their emitter electrodes 86 and 88, respectively, connected to two gain terminals 96 and 98 which in turn are connected by a gain controlling impedance 99, which could be a short. By interconnecting the two amplifying transistor emitters 86 and 88 to an appropriate gain controlling impedance 99, the two amplifying transistors 42 and 44 operate as a differential amplifier, the characteristics of which are well known in the electronics art.

Both amplifying transistor emitter electrodes 86 and 88 are connected through two emitter terminals 100 and 101 to a constant current generator 102 as shown within the dotted lines, the constant current generator 102 comprising first and second current generating transistors 103 and 104, respectively. The first current generating transistor 103 has its collector electrode connected to the emitter 86 of the first amplifying transistor 42 and its emitter electrode 105 connected through a biasing resistor 106 to a negative dc voltage source 107. In a similar manner, the second constant current generating transistor 104 has its collector electrode connected to the emitter electrode 88 of the second amplifying transistor 44, and its emitter electrode 108 connected through a biasing resistor 109 to the negative dc voltage source 107. Current supplied by each current generating transistor 103 and 104 is controlled by a dc bias voltage source 110 connected to the base electrodes of each transistor 103 and 104. The two current generating transistors 103 and 104 provide a constant current flow through each of the amplifying transistors 42 and 44 regardless of the magnitude of the signal appearing across the input signal terminals 50 and 52. Having thus described the basic elements associated with a transconductance balanced modulator, and how they are interconnected with respect to each other, various output interconnections and control signal inputs will be described.

As previously explained, the first and second amplifying transistors 42 and 44 when having their emitters 86 and 88 interconnected through an appropriate impedance 99 and connected to respective constant current generating transistors 103 and 104, will act as a differential amplifier. Thus, an input signal appearing across the two base electrodes 46 and 48 will cause corresponding current signals to appear at the two collectors 53 and 58, respectively. As basic electronic theory teaches, the current at the first amplifying transistor collector 53 due to an input signal across the two input signal terminals 50 and 52 will be equal in magnitude but opposite in polarity to the current at the second amplifying transistor collector 58. By applying an appropriate control signal to the control signal terminals 66 and 68, it is possible to bias one transistor from each pair of current dividing transistors completely off. Thus the two transistors 56 and 62 connected to one control signal terminal 68, or the two transistors 57 and 61 connected to the other control signal terminal 66, can be either biased completely off or fully conducting depending on the signal applied at the control signal terminals 66 and 68. As one can appreciate, the current through the first amplifying transistor 42 can be directed to either one of the current dividing transistors 56 and 57 in accordance with the state of a control signal input, the state also controlling which current dividing transistor 61 or 62 will carry the current from the second amplifying transistor 44. If the output terminals 70, 72, 74, and 76 of the current dividing transistors 56, 57, 61 and 62, respectively, are interconnected so that one transistor from each current dividing pair 56 and 61 is connected to one common output terminal 116, and the other two output transistors 57 and 62 are connected to another common output terminal 118, a means has been provided whereby the transconductance balanced modulator 40 will act as a polarity switch provided that the signal at the control signal terminals 66 and 68 is chosen so that a voltage differential across the terminals is always sufficient to bias two of the output transistors 56 and 62 or 57 and 61 off. It is important that the two transistors chosen to be connected to each common output terminal 116 or 118 have their base electrodes connected to different control signal terminals 66 and 68.

In operation, an amplified input signal appearing at the collector 53 of the first amplifying transistor 42 has opposite polarity with respect to an amplified input signal appearing at the collector 58 of the second amplifying transistor 44. Assuming that a polarity control signal appearing across the control signal terminals 66 and 68 is sufficient to bias two of the output transistors 56 and 62 off, a current having one polarity will flow through the other output transistor 57 associated with the first amplifying transistor 42, thereby causing a voltage having that same polarity to be present at the second common output terminal 118. The other transistor 62 will not affect the output voltage appearing at the second common output terminal 118 because it is biased off. In a similar manner, current flowing through the second amplifying transistor 44 is directed to one of its current dividing transistors 61 since the other current dividing transistor 62 is biased off as previously explained. Thus the voltage appearing at the first common ouput terminal due to a changing current through the current dividing transistor 61 will be equal in magnitude and opposite in phase to that appearing at the second common output terminal 118. The other current dividing transistor 56 connected to the first common output terminal 116 will not contribute any voltage thereto because it is biased to cut-off as previously explained. If the polarity control signal at the control signal terminals 66 and 68 now changes so that the non-conducting transistors 56 and 62 conduct, and the conducting transistors 57 and 61 no longer conduct, then the current passing through the first amplifying transistor 42, will flow through the conducting transistor 56 and a voltage developed thereby will appear at the first common output terminal 116. Thus, one can appreciate that a voltage having a given polarity, and developed by current flowing through the first amplifying transistor 42, has been transferred from the second common output terminal 118 to the first common output terminal 116 due to a change in current flow through the first pair of current dividing transistors 56 and 57. A similar change in polarity of the signal appearing at the second common output terminal 118 occurs as a result of the current flowing through the second amplifying transistor 44 being switched from one current dividing transistor 61 to the other 62. Thus, polarity of a signal appearing at the common output terminals 116 and 118 will shift by 180 degrees in accordance with a polarity control signal appearing at the control signal terminals 66 and 68. If the four output transistors 56, 57, 61 and 62 are silicon transistors, the control signal appearing across the control signal terminals 66 and 68 must have a voltage differential of at least one volt to insure that two of the output transistors will be biased off.

The transconductance balanced modulator 40 configured as a polarity switch as above-described can also be operated as an AGC amplifier by varying an AGC voltage appearing at the control signal terminals 66 and 68 between zero and a value just under that at which two of the output transistors 56 and 62, or 57 and 61 will be biased off. The modulator 40 when operated in this manner provides an amplified output signal proportional to the AGC voltage. The current flowing through the first amplifying transistor 42 is proportionally divided between the first pair of current dividing transistors 56 and 57 according to the value of the AGC voltage. Similarly, the current flowing through the second amplifying transistor 44 is also proportionally divided between the second pair of current dividing transistors 61 and 62 according to the value of the AGC voltage. The output appearing at the first common output terminal 116 is proportional to the sum of the amplified input signals appearing at the collectors of the two transistors 56 and 61 connected thereto. Because the signal currents flowing through each of these transistors 56 and 61 have opposite polarity with respect to each other, the output voltage resulting from the summing of the two signals is always less than or equal to the largest signal. As one can appreciate, if the AGC voltage across the control signal terminals 66 and 68 changes so than one transistor 56 of the first pair of current dividing transistor pairs 56 and 57 is carrying more current, one transistor 61 of the second current dividing transistor pair 61 is being driven towards cut-off, thereby reducing the signal current flowing therethrough. Thus, the output voltage appearing at the first common output terminal 116 will increase as the AGC signal continues to change as above-described. Each pair of output transistors 56 and 61, and 57 and 62 connected to their respective common output terminals 116 and 118 operate in a similar manner. Again, it is the current dividing characteristic of a transconductance balanced modulator when utilized according to the teachings of the invention which allows such a modulator to be operated as an AGC amplifier.

The transconductance balanced modulator 40 can also be configured as a signal separation circuit to provide two output signals one of which comprises the first segments 12 of the input signal and other of which comprises the second segments 14 of the input signal as shown in FIG. 1, the segments 12 and 14 being defined by the clock pulse first state 22 and second state 24. When configured as a signal separator, the first segment 12 output signal is provided at the collector terminals 70 and 76 of the two output transistors 56 and 62 having their base electrodes connected to the second control signal terminal 68, and the second segment 14 output signal is provided at the collector terminals 72 and 74 of the two output transistors 57 and 61 having their base electrodes connected to the first control signal terminal 66. The interconnections of the output transistors 56, 57, 61 and 62 as represented by the dotted lines connected to the common output terminals 116 and 118 are not present in the signal separation configuration. The clock pulse 20 is applied across the control signal terminals 66 and 68, the first and second states 22 and 24 of which have a sufficient voltage differential with respect to each other to cause either one transistor pair 56 and 62 or the other transistor pair 57 and 61 to be biased off. Therefore if the first state 22 of the clock pulse is chosen so that the transistor 56 and 62 connected to the second control signal terminal 68 are cut-off, the amplified input signal will appear across the collector terminals 72 and 74 of the other two transistors 57 and 61. The second state 24 of the clock pulse 20 will then cause the transistors 57 and 61 connected to the first control signal terminal 66 to cut-off, thereby switching the amplified input signal to the collector terminals 70 and 76 of the conducting transistors 56 and 62. Thus, the amplified input signal is alternately being switched from one pair of collector terminals 72 and 74 to the other pair of collector terminals 70 and 76 in accordance with a first and second state 22 and 24 of the clock pulse 20. Again the current switching characteristic of a transconductance balanced modulator is utilized to alternately switch the output of a differential amplifier between two pair of output terminals, the switching being synchronized to state changes of a clock pulse control signal.

Figure 3:
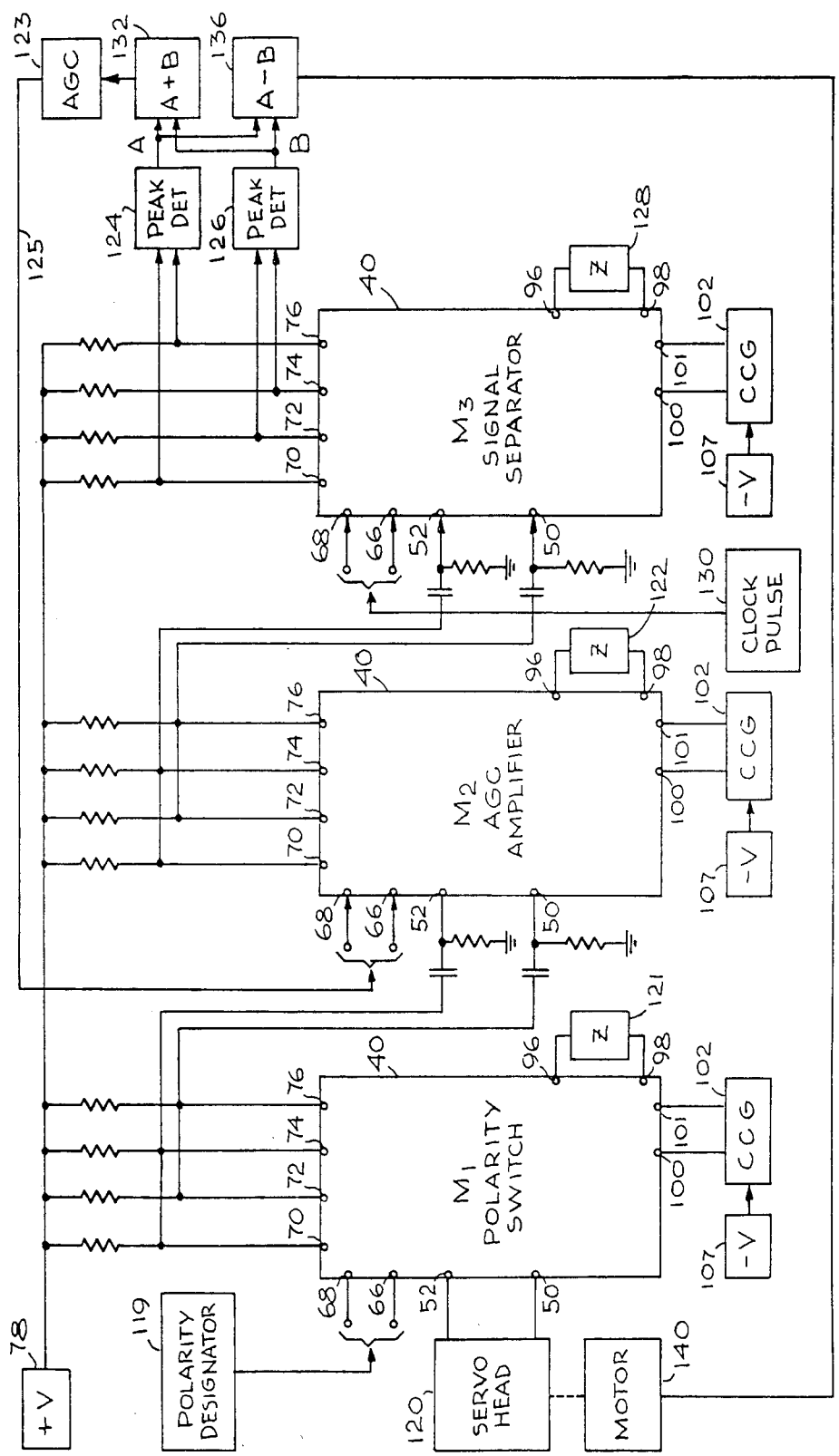
FIG. 3 is a block diagram of a servo preamplifier and demodulator chain utilizing three transconductance balanced modulators.

Uses for the above-described circuits are many and varied. The polarity switch, AGC amplifier and signal separator all utilized in the servo preamplifier and demodulator chain previously discussed. Referring to FIG. 3, three transconductance balanced modulators 40, designated $M_1$, $M_2$, and $M_3$, as shown in FIG. 2 are provided. Each has an associated constant current source 102, positive dc voltage source 78 and a negative dc voltage source 107. The first transconductance balanced modulator $M_1$ receives an input dibit signal from a zero head 120 at its input signal terminals 50 and 52. A polarity designator 119 provides a polarity control signal to the control signal terminals 66 and 68, the polarity control signal being chosen according to whether the servo head 120 is to be positioned on an odd or even numbered data track. An appropriate impedance 121 interconnects the two gain terminals 96 and 98, thereby configuring the transconductance balanced modulator $M_1$ as a differential amplifier. The output transistor $M_1$ collector terminals 70, 72, 74 and 76 are configured for a polarity switch as previously explained. Thus, the output signal from the first transconductance balanced modulator $M_1$ is an amplified dibit signal having a polarity with respect to the input dibit signal determined in accordance with the polarity control signal.

The second transconductance balanced modulator $M_2$ is configured as an AGC amplifier as previously explained, its gain terminals 96 and 98 being connected to an appropriate impedance 122. It is important that the AGC voltage applied across the control signal terminals 66 and 68 not change sign, a sign change resulting in a polarity reversal of the modulator $M_2$ output signal as previously explained. Biasing of the AGC voltage to prevent such a sign change is accomplished in an AGC bias generator 123, the circuitry of which is well understood in the electronics art.

The third transconductance balanced modulator $M_3$ is configured as the signal separator previously explained. The output transistors 56 and 62 connected to the second control signal terminal 68 have their collector terminals 70 and 76 connected to a first peak detector 124, the other two collector terminals 72 and 74 being connected to a second peak detector 126. The gain terminals 96 and 98 are connected to an appropriate impedance 128. As the clock pulse 20 from a clock pulse generator 130 is applied across the control signal terminals 66 and 68, the first segment 12 of the amplified input signal corresponding to the first state 22 of the clock pulse 20 is supplied to the first peak detector 124. In a similar manner, the second segment 14 of the amplified input signal corresponding to the second state 24 of the clock pulse 20 is supplied to the second peak detector 126. The output of the first peak detector 124, designated as A, and the output of the second peak detector 126, designated as B, are added by a summing network 132. The sum of the two detector outputs 124 and 126 is appropriately processed by the AGC bias generator 123 and supplied as an AGC control voltage to the AGC amplifier $M_2$. The AGC control voltage will continue to alter the gain of the AGC amplifier $M_2$ until the output of the summing network 132 corresponds to a predetermined value. The outputs from the first and second peak detectors 124 and 126 are provided to a difference network 136, the output of which comprises a drive signal to a head positioning motor 140, the motor 140 continuing to position the servo head 120 until the output from the difference network 136 is zero. As previously explained, the servor head 120, when centrally positioned on the data track, will output a dibit signal in which the peak-to-peak voltage 16 of the first segment 12 equals the peak-to-peak voltage 18 of the second segment 14. Thus, the output A of the first peak detector 124 will equal the output B of the second peak detector 126, thereby resulting in a zero output from the difference network 136.

In accordance with the description provided above, one should now appreciate how the current dividing capability of a transconductance balanced modulator can be utilized in accordance with the teachings of the invention to provide a polarity switch, an AGC amplifier, and a signal separator. The use of three such transconductance balanced modulators provides a means to standardize basic circuit elements of a servo preamplifier chain without requiring the use of special components, thereby lowering its cost and reducing fabrication time.

What is claimed is:

1. A method for amplifying and separating an input signal into first and second segments and providing a first output signal comprising said first segments and a second output signal comprising said second segments, the steps comprising:

amplifying an input signal by a differential amplifier having first and second amplifying means;

providing a clock signal synchronized to said input signal and having a first state in time-correspondence with said first segment to be separated and a second state in time-correspondence with said second segment to be separated; and directing an amplified output of said differential amplifier to a first output terminal pair if said clock signal is in said first state or to a second output terminal pair if said clock signal is in said second state.

2. A polarity switching apparatus comprising:

a differential amplifier having first and second amplifying means, each having an input and an output;

polarity switch means including first, second, third and fourth polarity switches, each switch having an input terminal, an output terminal, and a control terminal;

means connecting said first amplifying means output to the input terminals of said first and second switches;

means connecting said second amplifying means output to the input terminals of said third and fourth switches;

a first control signal terminal connected in common to the control terminals of said first and fourth switches;

a second control signal terminal connected in common to the control terminals of said second and third switches;

means connecting the output terminals of said first and third switches in common; and means connecting the output terminals of said second and fourth switches in common.

* * * * *